(12) United States Patent
Fudeta et al.

(10) Patent No.: US 9,530,932 B2
(45) Date of Patent: Dec. 27, 2016

(54) NITRIDE SEMICONDUCTOR LIGHT-EMITTING DEVICE AND METHOD FOR PRODUCING THE SAME

(71) Applicant: Sharp Kabushiki Kaisha, Osaka-shi (JP)

(72) Inventors: Mayuko Fudeta, Osaka (JP); Satoshi Komada, Osaka (JP); Ryu Kaihara, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 14/721,760

(22) Filed: May 26, 2015

(65) Prior Publication Data
US 2015/0255673 A1    Sep. 10, 2015

Related U.S. Application Data

(63) Continuation of application No. 13/533,649, filed on Jun. 26, 2012, now Pat. No. 9,070,805.

(30) Foreign Application Priority Data

Jun. 30, 2011   (JP) .................................. 2011-145900

(51) Int. Cl.
*H01L 23/48* (2006.01)
*H01L 29/22* (2006.01)
(Continued)

(52) U.S. Cl.
CPC ............... *H01L 33/06* (2013.01); *H01L 33/04* (2013.01); *H01L 33/22* (2013.01); *H01L 33/32* (2013.01); *H01L 2933/0033* (2013.01)

(58) Field of Classification Search
CPC ........ H01L 23/48; H01L 29/22; H01L 31/072; H01L 29/06; H01L 27/15; H01L 33/00; H01L 29/72
(Continued)

(56) References Cited

U.S. PATENT DOCUMENTS 5,076,860 A * 12/1991 Ohba et al. .................. 148/33.1
5,153,889 A   10/1992 Sugawara et al.
(Continued)

FOREIGN PATENT DOCUMENTS

CN   100485984   5/2009
CN   101488550   7/2009
(Continued)

OTHER PUBLICATIONS

Fudeta, et al., U.S. Office Action mailed Mar. 15, 2013, directed to U.S. Appl. No. 13/533,649; 14 pages.
(Continued)

*Primary Examiner* — David Vu
*Assistant Examiner* — Mouloucoulaye Inoussa
(74) *Attorney, Agent, or Firm* — Morrison & Foerster LLP (57) ABSTRACT

A nitride semiconductor light-emitting device has a first conductive-type nitride semiconductor layer, a superlattice layer provided on the first conductive-type nitride semiconductor layer, an active layer provided on the superlattice layer, and a second conductive-type nitride semiconductor layer provided on the active layer. An average carrier concentration of the superlattice layer is higher than an average carrier concentration of the active layer.

5 Claims, 3 Drawing Sheets

(51) Int. Cl.
*H01L 33/06* (2010.01)
*H01L 33/04* (2010.01)
*H01L 33/32* (2010.01)
*H01L 33/22* (2010.01)

(58) Field of Classification Search
USPC ............. 257/94, 98, 102, 103, 618; 438/689
See application file for complete search history.

(56) References Cited

U.S. PATENT DOCUMENTS

| | | | |
|---|---|---|---|
| 5,932,896 | A | 8/1999 | Sugiura et al. |
| 6,172,382 | B1 | 1/2001 | Nagahama et al. |
| 6,242,761 | B1 | 6/2001 | Fujimoto et al. |
| 6,337,493 | B1 | 1/2002 | Tanizawa et al. |
| 6,657,234 | B1 | 12/2003 | Tanizawa |
| 6,677,619 | B1 | 1/2004 | Nagahama et al. |
| 7,646,009 | B2 | 1/2010 | Kozaki |
| RE42,008 | E | 12/2010 | Tanizawa |
| 2002/0053676 | A1* | 5/2002 | Kozaki ............................ 257/88 |
| 2003/0020061 | A1 | 1/2003 | Emerson et al. |
| 2003/0203629 | A1 | 10/2003 | Ishibashi et al. |
| 2003/0209705 | A1* | 11/2003 | Emerson ............... H01L 33/007 257/14 |
| 2004/0004223 | A1 | 1/2004 | Nagahama et al. |
| 2004/0072383 | A1* | 4/2004 | Nagahama ........ H01L 21/76251 438/47 |
| 2005/0040406 | A1 | 2/2005 | Nakagawa |
| 2005/0067613 | A1 | 3/2005 | Kim |
| 2005/0121679 | A1 | 6/2005 | Nagahama et al. |
| 2005/0127394 | A1 | 6/2005 | Nagahama et al. |
| 2005/0211971 | A1 | 9/2005 | Okumura |
| 2005/0249255 | A1* | 11/2005 | Dwilinski ................. C30B 9/00 372/49.01 |
| 2007/0045638 | A1 | 3/2007 | Shen et al. |
| 2007/0138489 | A1 | 6/2007 | Hooper et al. |
| 2008/0116476 | A1 | 5/2008 | Komada |
| 2010/0025657 | A1 | 2/2010 | Nagahama et al. |
| 2010/0288999 | A1 | 11/2010 | Kikuchi et al. |
| 2011/0049544 | A1 | 3/2011 | Komada |
| 2011/0187294 | A1 | 8/2011 | Bergmann et al. |
| 2011/0188528 | A1 | 8/2011 | Kisin et al. |
| 2011/0220867 | A1 | 9/2011 | Khan et al. |
| 2013/0001637 | A1 | 1/2013 | Fudeta |

FOREIGN PATENT DOCUMENTS

| | | |
|---|---|---|
| CN | 101834245 | 9/2010 |
| EP | 1 619 729 | 1/2006 |
| JP | 11-26382 | 1/1999 |
| JP | 2000-349337 | 12/2000 |
| JP | 2001-298215 | 10/2001 |
| JP | 2005-109425 | 4/2005 |
| JP | 2007-67418 | 3/2007 |
| JP | 2007-150312 | 6/2007 |
| JP | 2008-130899 | 6/2008 |
| JP | 2009-231609 | 10/2009 |
| TW | 200605388 | 2/2006 |

OTHER PUBLICATIONS

Fudeta et al., U.S. Office Action mailed Sep. 11, 2013, directed to U.S. Appl. No. 13/533,649; 12 pages.

Fudeta et al., U.S. Advisory Action mailed Dec. 19, 2013, directed to U.S. Appl. No. 13/533,649; 3 pages.

Fudeta et al., U.S. Office Action mailed Mar. 20, 2014, directed to U.S. Appl. No. 13/533,649; 13 pages.

Fudeta et al., U.S. Office Action mailed Jul. 17, 2014, directed to U.S. Appl. No. 13/533,649; 13 pages.

Fudeta et al., U.S. Office Action mailed Dec. 3, 2014, directed to U.S. Appl. No. 13/533,649; 14 pages.

Fudeta, M., U.S. Office Action mailed Dec. 21, 2012, directed to U.S. Appl. No. 13/535,000; 8 pages.

Fudeta, M., U.S. Office Action mailed Aug. 14, 2013, directed to U.S. Appl. No. 13/535,000; 9 pages.

Fudeta, M., U.S. Office Action mailed May 9, 2014, directed to U.S. Appl. No. 13/535,000; 23 pages.

Fudeta, M., U.S. Office Action mailed Sep. 11, 2014, directed to U.S. Appl. No. 13/535,000; 14 pages.

Pelá, R.R. et al. (2011). "Accurate Band Gaps of AlGaN, InGaN, and AlInN Alloys Calculations Based on LDA-1/2 Approach," *Applied Physics Letters* 151907-151907-3.

Fudeta et al., Advisory Action mailed Feb. 23, 2015, directed to U.S. Appl. No. 13/533,649; 3 pages.

\* cited by examiner

NITRIDE SEMICONDUCTOR LIGHT-EMITTING DEVICE AND METHOD FOR PRODUCING THE SAME

This is a continuation application of U.S. application Ser. No. 13/533,649, filed Jun. 26, 2012, which is a nonprovisional application based on Japanese Patent Application No. 2011-145900, filed Jun. 30, 2011, the entire contents of which are hereby incorporated by reference.

BACKGROUND OF THE INVENTION

Field of the Invention

The present invention relates to a nitride semiconductor light-emitting device and a method for producing the same.

Description of the Background Art

Conventionally, a nitride semiconductor light-emitting device usable for a light-emitting diode or the like is known. In such a nitride semiconductor light-emitting device, when a voltage is applied, an electron and a hole are recombined in an active layer, and as a result, light is generated. The active layer may have a single quantum well structure, or may have a multiple quantum well structure as described in Japanese Patent Laying-Open No. 2005-109425 and Japanese Patent Laying-Open No. 2000-349337, for example. Japanese Patent Laying-Open No. 2005-109425 describes that an active layer is formed by sequentially stacking a non-doped InGaN quantum well layer and a GaN barrier layer doped with an n-type impurity. This publication also describes that the GaN barrier layer doped with an n-type impurity has a diffusion preventive film at the interface where the GaN barrier layer is in contact with the aforementioned InGaN quantum well layer, and that the diffusion preventive film contains an n-type impurity at a concentration lower than that in the GaN barrier layer.

Japanese Patent Laying-Open No. 2000-349337 describes that an active layer contains an n-type impurity, and that concentration of the n-type impurity in the active layer is higher in the n layer side than in the p layer side.

Recently, as use application of a nitride semiconductor light-emitting device, a backlight for liquid crystal and an electric bulb for illumination are considered, and the case where a nitride semiconductor light-emitting device is driven at a large current is on the increase.

SUMMARY OF THE INVENTION

When a nitride semiconductor light-emitting device is produced according to the techniques as described in Japanese Patent Laying-Open No. 2005-109425 or Japanese Patent Laying-Open No. 2000-349337, and the produced nitride semiconductor light-emitting device is driven at a large current, the operation voltage can rise to lead increase in power consumption, and deterioration in light emission efficiency can be incurred. From this, deterioration in light emission efficiency per unit power (power efficiency) can also be incurred.

It is generally believed that deterioration in light emission efficiency when the current density applied to a nitride semiconductor light-emitting device is relatively low is caused by a number of levels existing in the nitride semiconductor layer that induce non-light-emitting recombination (crystal defect and so on). Therefore, a typical conventional measure for improving the light emission efficiency of a nitride semiconductor light-emitting device is to decrease crystal defects in the nitride semiconductor layer. However, as the density of the current applied to the nitride semiconductor light-emitting device increases, it becomes difficult to improve the light emission efficiency only by decreasing crystal defects in the nitride semiconductor layer, and as the current density increases, a problem of decrease in light emission efficiency of the nitride semiconductor light-emitting device is incurred.

As a cause of such a problem, occurrence of non-light-emitting recombination in a layer other than the active layer is expected. To be more specific, as the current density increases, the quantity of generated heat increases by a resistance component of the active layer, and the temperature at PN junction contacting the active layer increases. As a result, carriers such as electrons and holes overflow from the active layer, and non-light-emitting recombination occurs in a layer other than the active layer.

Further, as the density of the current applied to the nitride semiconductor light-emitting device increases, the density of injected carriers in the active layer resulting from the current injection increases. When the density of injected carriers in the active layer increases, Auger recombination (non-light-emitting recombination where probability of recombination increases in proportional to the cube of carrier concentration) becomes dominant. Therefore, it is difficult to prevent occurrence of non-light-emitting recombination.

When light-emitting recombination lifetime is prolonged due to a piezoelectric field in the active layer or the like, decrease in probability of light-emitting recombination is incurred, and hence, increase in probability of non-light-emitting recombination mediated by a crystal defect, further increase in probability of occurrence of carrier overflow, and further increase in probability of Auger recombination are incurred.

Here, overflow of carriers from the active layer is more likely to occur as the temperature at PN junction increases. Therefore, a lower temperature at PN junction is desired. Recently, owing to advanced packaging technology, a nitride semiconductor light-emitting device has very excellent heat radiation property, and is able to release the heat caused, for example, by contact resistance of an electrode to the package. However, since the active layer is far from the package, it is difficult to release the heat generated by a resistance component of the active layer to the package. While heat caused by various resistance components is generated in a nitride semiconductor light-emitting device, it is the most difficult issue to solve the trouble of heat generated by a resistance component of the active layer.

Further, when the density of injected carriers occurring by current injection in the active layer increases, Auger recombination is inevitably more likely to occur. Therefore, it is desired to make the injected carrier density in the active layer low. As a measure for decreasing the injected carrier density in the active layer, a method of making the chip size larger to increase the light emission area and decrease the current value per unit area, thereby decreasing the density of the carriers that are actually injected per unit volume can be supposed. However, when the chip size is made larger, the number of chips that can be produced from one wafer is also decreased, and increase in cost of the nitride semiconductor light-emitting device will be incurred.

As another measure for decreasing the density of injected carriers in the active layer, a method of increasing the thickness of well layer in a multiple quantum well structure, and a method of increasing the number of layers of well layer can be supposed. However, when the thickness of well layer is too large, deterioration in crystal quality of the well layer will be incurred. Also, when the number of layers of well layer is too large, increase in operation voltage of the nitride semiconductor light-emitting device will be incurred.

The present invention is devised in consideration of these points, and it is an object of the present invention to produce a nitride semiconductor light-emitting device capable of preventing increase in operation voltage and deterioration in light emission efficiency even at the time of driving at a large current, and thus realizing excellent power efficiency.

A nitride semiconductor light-emitting device according to the present invention has a first conductive-type nitride semiconductor layer, a superlattice layer provided on the first conductive-type nitride semiconductor layer, an active layer provided on the superlattice layer, and a second conductive-type nitride semiconductor layer provided on the active layer. An average carrier concentration of the superlattice layer is higher than an average carrier concentration of the active layer, and is preferably greater than or equal to 1.2 times the average carrier concentration of the active layer.

When the superlattice layer has a doped layer containing the first conductive-type impurity and the active layer has a barrier layer, a proportion of thickness per one layer of the doped layer to thickness per one period of the superlattice layer is preferably greater than or equal to a proportion of thickness per one layer of the barrier layer to thickness per one period of the active layer.

Preferably, concentration of the first conductive-type impurity in the doped layer is greater than or equal to concentration of the first conductive-type impurity in the barrier layer.

When the superlattice layer has an undoped layer not containing a first conductive-type impurity and the active layer has a well layer not containing a first conductive-type impurity, a proportion of thickness per one layer of the undoped layer to thickness per one period of the superlattice layer is preferably less than or equal to a proportion of thickness per one layer of the well layer to thickness per one period of the active layer.

Preferably, the undoped layer is in contact with a lower face of the active layer.

Preferably, the superlattice layer has two or more layers of doped layer.

Preferably, thickness per one doped layer is greater than or equal to 1.5 nm.

Preferably, concentration of the first conductive-type impurity in the doped layer is greater than or equal to $1 \times 10^{17}$ $cm^{-3}$.

The barrier layer may not contain a first conductive-type impurity, and concentration of the first conductive-type impurity in the barrier layer may be greater than or equal to $1 \times 10^{16}$ $cm^{-3}$ and less than or equal to $8 \times 10^{17}$ $cm^{-3}$.

Preferably, the active layer has two or more layers of well layer.

Preferably, thickness of the barrier layer is less than or equal to 7 nm.

Preferably, between the first conductive-type nitride semiconductor layer and the superlattice layer, a short period superlattice layer having a thickness per one period that is smaller than thickness per one period of the superlattice layer is provided. Preferably, concentration of the first conductive-type impurity in the short period superlattice layer is greater than or equal to $1 \times 10^{18}$ $cm^{-3}$ and less than or equal to $5 \times 10^{19}$ $cm^{-3}$.

Preferably, the superlattice layer is formed of lamination of a doped layer and an undoped layer. The doped layer contains, for example, a first conductive-type impurity and $Al_a Ga_b In_{(1-a-b)} N$ ($0 \leq a < 1$, $0 < b \leq 1$), and the undoped layer is formed, for example, of $In_c Ga_{(1-c)} N$ ($0 < c \leq 1$).

Preferably, the active layer is formed of lamination of a barrier layer and a well layer. The barrier layer contains, for example, a first conductive-type impurity and $Al_x Ga_y In_{(1-x-y)} N$ ($0 \leq x < 1$, $0 < y \leq 1$), and the well layer is formed, for example, of $In_z Ga_{(1-z)} N$ ($0 < z \leq 1$).

When the superlattice layer and the active layer contain In, wavelength of light emitted by the superlattice layer by photoluminescence is preferably less than or equal to wavelength of light emitted by the active layer.

A method for producing a nitride semiconductor layer light-emitting device according to the present invention includes a step of growing a first conductive-type nitride semiconductor layer on a substrate, a step of growing a superlattice layer on the first conductive-type nitride semiconductor layer, a step of growing an active layer on the superlattice layer, and a step of growing a second conductive-type nitride semiconductor layer on the active layer. A growth rate of the superlattice layer is preferably greater than or equal to a growth rate of a well layer which is a part of the active layer, and a growth rate of the aforementioned first undoped layer is preferably greater than or equal to a growth rate of the well layer.

When the aforementioned first doped layer is grown using a first source gas and a first carrier gas, the first carrier gas preferably contains greater than or equal to 0.3% by volume and less than or equal to 30% by volume of hydrogen gas.

A growth temperature of the superlattice layer may be the same with a growth temperature of the active layer, or may be higher than the growth temperature of the active layer.

The growth rate of the well layer is, for example, greater than or equal to 10 nm/hour and less than or equal to 150 nm/hour.

For making the average carrier concentration of the superlattice layer higher than the average carrier concentration of the active layer, it is preferred that either one of the following Requirements 1 to 4 is satisfied, and it is more preferred that at least two of the following Requirements 1 to 4 are satisfied.

Requirement 1: A proportion of thickness per one layer of the doped layer to thickness per one period of the superlattice layer is higher than a proportion of thickness per one layer of the barrier layer to thickness per one period of the active layer.

Requirement 2: Concentration of the first conductive-type impurity in the doped layer is higher than concentration of the first conductive-type impurity in the barrier layer.

Requirement 3: A proportion of thickness per one layer of the undoped layer to thickness per one period of the superlattice layer is lower than a proportion of thickness per one layer of the well layer to thickness per one period of the active layer.

Requirement 4: A growth rate of the superlattice layer (preferably undoped layer) is faster than a growth rate of the well layer.

When at least one of the foregoing Requirements 2 to 4 is satisfied, Requirement 1 may be replaced by "A proportion of thickness per one layer of the doped layer to thickness per one period of the superlattice layer is greater than or equal to a proportion of thickness per one layer of the barrier layer to thickness per one period of the active layer."

Likewise, when at least one of the foregoing Requirement 1 and Requirements 3 to 4 is satisfied, Requirement 2 may be replaced by "Concentration of the first conductive-type impurity in the doped layer is greater than or equal to concentration of the first conductive-type impurity in the barrier layer."

When at least one of the foregoing Requirements 1 to 2 and Requirement 4 is satisfied, Requirement 3 may be replaced by "A proportion of thickness per one layer of the undoped layer to thickness per one period of the superlattice layer is less than or equal to a proportion of thickness per one layer of the well layer to thickness per one period of the active layer."

When at least one of the foregoing Requirements 1 to 3 is satisfied, Requirement 4 may be replaced by "A growth rate of the superlattice layer (preferably undoped layer) is equal to a growth rate of the well layer or faster than a growth rate of the well layer."

According to the nitride semiconductor light-emitting device of the present invention, even when it is driven at a large current, increase in operation voltage is prevented, and decrease in light emission efficiency is prevented, and accordingly, excellent power efficiency is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to drawings.

In the following, "first conductive-type" and "second conductive-type" in claims are described as "n-type" and "p-type", respectively, however, "first conductive-type" and "second conductive-type" in claims may be respectively described as "p-type" and "n-type".

The present invention will not be limited to the following embodiments. Further, in the drawings of the present invention, length, width, thickness and the like dimensional relationships are appropriately modified for clarification and simplification of the drawings, and do not represent actual dimensional relationships.

<First Embodiment>

Figure 1:
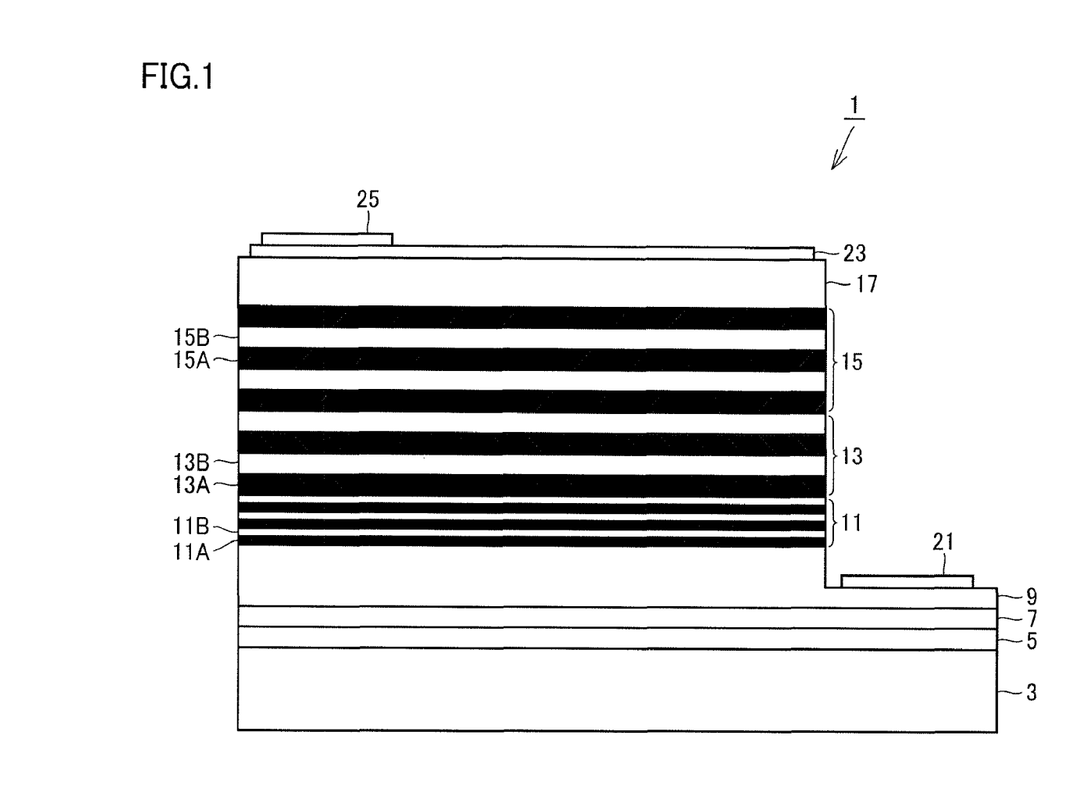
FIG. 1 is a schematic sectional view of a nitride semiconductor light-emitting device according to one embodiment of the present invention.

In a nitride semiconductor light-emitting device 1 according to the first embodiment of the present invention, an average carrier concentration of a long-period superlattice layer 13 is higher than an average carrier concentration of an active layer 15.

<Nitride Semiconductor Light-Emitting Device>

Nitride semiconductor light-emitting device 1 according to the present embodiment is made up of a buffer layer 5, a base layer 7, an n-type nitride semiconductor layer 9, a short-period superlattice layer 11, long-period superlattice layer 13, active layer 15, and a p-type nitride semiconductor layer 17 stacked in this order on an upper face of a substrate 3. A part of an upper face of n-type nitride semiconductor layer 9 is exposed from short-period superlattice layer 11 and the like, and on the exposed part, an n-side electrode 21 is provided. On p-type nitride semiconductor layer 17, a p-side electrode 25 is provided with a transparent electrode 23 interposed therebetween.

<Substrate>

Substrate 3 may be, for example, an insulating substrate made of sapphire or the like, or may be a conductive substrate made of GaN, SiC, ZnO or the like. A thickness of substrate 3 is not particularly limited, and is preferably greater than or equal to 60 µm and less than or equal to 300 µm. The upper face of substrate 3 may be flat or may be concavoconvex.

<Buffer Layer>

Buffer layer 5 is preferably, for example, an $Al_{s0}Ga_{t0}N$ (0≤s0≤1, 0≤t0≤1, s0+t0≠0) layer, and more preferably an AlN layer. As a result, buffer layer 5 is formed to extend in the normal direction of the growth face of substrate 3, and hence buffer layer 5 made up of an assembly of columnar crystals having uniform crystal grains is obtained.

Thickness of buffer layer 5 is not particularly limited, and is preferably greater than or equal to 5 nm and less than or equal to 100 nm, and more preferably greater than or equal to 10 nm and less than or equal to 50 nm.

<Base Layer>

Base layer 7 is preferably, for example, an $Al_{s1}Ga_{t1}In_{u1}N$ (0≤s1≤1, 0≤t1≤1, 0≤u1≤1, s1+t1+u1≠0) layer, and more preferably an $Al_{s1}Ga_{t1}N$ (0≤s1≤1, 0≤t1≤1, s1+t1≠0) layer, and further preferably a GaN layer. As a result, a crystal defect (such as dislocation or the like) existing in buffer layer 5 is more likely to be looped near the interface between buffer layer 5 and base layer 7, and hence it is possible to prevent the crystal defect from being taken over to base layer 7 from buffer layer 5.

Base layer 7 may contain an n-type impurity. However, when base layer 7 does not contain an n-type impurity, excellent crystallinity of base layer 7 can be maintained. Therefore, it is preferred that base layer 7 does not contain an n-type impurity.

A thickness of base layer 7 is not particularly limited, and preferably greater than or equal to 3 µm and less than or equal to 12 µm.

<N-Type Nitride Semiconductor Layer>

N-type nitride semiconductor layer 9 is preferably, for example, an $Al_{s1}Ga_{t2}In_{u2}N$ (0≤s2≤1, 0≤t2≤1, 0≤u2≤1, s2+t2+u2≠0) layer doped with an n-type impurity, and more preferably an $Al_{s2}Ga_{1-s2}N$ (0≤s2≤1, preferably 0≤s2≤0.5, more preferably 0≤s2≤0.1) layer doped with an n-type impurity.

The n-type impurity is not particularly limited, and is preferably Si, P, As, Sb or the like, and more preferably Si. This also applies in later-described short-period superlattice layer 11 and so on.

Concentration of the n-type impurity in n-type nitride semiconductor layer 9 is not particularly limited, and is preferably greater than or equal to $1 \times 10^{18}$ cm$^{-3}$ and less than or equal to $2 \times 10^{19}$ cm$^{-3}$.

Thickness of n-type nitride semiconductor layer 9 is not particularly limited, and preferably greater than or equal to 0.5 µm and less than or equal to 10 µm.

N-type nitride semiconductor layer 9 may be a monolayer or may have a laminated structure. For example, n-type nitride semiconductor layer 9 may be formed by stacking an n-type contact layer and an n-type clad layer. When n-type nitride semiconductor layer 9 has a laminated structure, individual layers may have the same composition, or may have different compositions. Also, individual layers may have the same film thickness or may have different film thicknesses.

<Short-Period Superlattice Layer>

The superlattice layer means a layer made up of a crystal lattice having a periodical structure longer than that of a basic unit lattice by superposition of plural kinds of crystal lattices. In short-period superlattice layer 11, first semiconductor layer 11A and second semiconductor layer 11B are alternately stacked to form a superlattice structure, and its periodical structure is longer than the basic unit lattice of the semiconductor material forming first semiconductor layer 11A and the basic unit lattice of the semiconductor material forming second semiconductor layer 11B. Short-period superlattice layer 11 may form a superlattice structure by sequential stacking of first semiconductor layer 11A, second semiconductor layer 11B, and one or more layer of semiconductor layer other than first semiconductor layer 11A and second semiconductor layer 11B. Thickness per one cycle of short-period superlattice layer 11 is smaller than thickness per one period of long-period superlattice layer 13 as will be later described, and concretely greater than or equal to 1 nm and less than or equal to 7 nm.

Each first semiconductor layer 11A is preferably, for example, an AlGaInN layer doped with an n-type impurity, and more preferably a GaN layer doped with an n-type impurity.

Concentration of the n-type impurity in each first semiconductor layer 11A is not particularly limited, and may be higher than concentration of the n-type impurity in later-described long-period superlattice layer 13, or may be less than or equal to concentration of the n-type impurity in later-described long-period superlattice layer 13. Concentration of the n-type impurity in each first semiconductor layer 11A is preferably, for example, greater than or equal to $1 \times 10^{18}$ cm$^{-3}$ and less than or equal to $5 \times 10^{19}$ cm$^{-3}$. The obtainable result will be shown in later-described <Average carrier concentration>.

Thickness of each first semiconductor layer 11A is not particularly limited, and preferably greater than or equal to 0.5 nm and less than or equal to 5 nm, and more preferably greater than or equal to 1 nm and less than or equal to 4 nm. When thickness of each first semiconductor layer 11A is less than 0.5 nm, thickness of each first semiconductor layer 11A is smaller than thickness of a monoatomic layer, so that it is difficult to form first semiconductor layer 11A having a uniform thickness, and deterioration in crystal quality of later-described long-period superlattice layer 13 or active layer 15 can be incurred. Since first semiconductor layer 11A is doped with a high concentration of the first conductive-type impurity at a temperature lower than the temperature at the time of doping n-type nitride semiconductor layer 9 with the first conductive-type impurity, when thickness of each first semiconductor layer 11A exceeds 5 nm, deterioration in flatness of first semiconductor layer 11A is incurred, and thus crystallinity of later-described long-period superlattice layer 13 is deteriorated. As a result, crystal quality of active layer 15 is also deteriorated and light emission efficiency of nitride semiconductor light-emitting device 1 may be deteriorated.

Each second semiconductor layer 11B is preferably, for example, an AlGaInN layer, and more preferably an InGaN layer. When second semiconductor layer 11B does not contain an n-type impurity, deterioration in flatness of short-period superlattice layer 11 can be prevented, and thus deterioration in crystallinity of later-described long-period superlattice layer 13 can be prevented. Each second semiconductor layer 11B may contain an n-type impurity.

Thickness of each second semiconductor layer 11B is not particularly limited, and preferably greater than or equal to 0.5 nm and less than or equal to 5 nm, and more preferably greater than or equal to 1 nm and less than or equal to 4 nm. When thickness of each second semiconductor layer 11B is less than 0.5 nm, thickness of each second semiconductor layer 11B is smaller than thickness of a monoatomic layer, so that it is difficult to form second semiconductor layer 11B having a uniform thickness, and deterioration in crystal quality of later-described long-period superlattice layer 13 or active layer 15 can be incurred. On the other hand, when thickness of each second semiconductor layer 11B exceeds 5 nm, the time required for growth of second semiconductor layer 11B is too long, and productivity of nitride semiconductor light-emitting device 1 may be deteriorated.

The numbers of layers of first semiconductor layer 11A and second semiconductor layer 11B are not limited to the numbers of layers shown in FIG. 1.

<Long-Period Superlattice Layer>

Long-period superlattice layer 13 corresponds to "superlattice layer" in claims. Here, definition of the superlattice layer is as described in the above <Short-period superlattice layer>. In long-period superlattice layer 13, doped layer 13A and undoped layer 13B are alternately stacked to form a superlattice structure, and a periodical structure thereof is longer than the basic unit lattice of the semiconductor material forming doped layer 13A and the basic unit lattice of the semiconductor material forming undoped layer 13B. Likewise short-period superlattice layer 11, long-period superlattice layer 13 may form a superlattice structure by sequential stacking of doped layer 13A, undoped layer 13B and one or more layer of semiconductor layer other than doped layer 13A and undoped layer 13B. Length per one period of long-period superlattice layer 13 is longer than that of short-period superlattice layer 11 as described above, and concretely greater than or equal to 4 nm and less than or equal to 20 nm.

An average carrier concentration of long-period superlattice layer 13 is higher than an average carrier concentration of later-described active layer 15. Accordingly, it is possible to prevent deterioration in power efficiency even when nitride semiconductor light-emitting device 1 is driven at a large current. This will be shown in later-described <Average carrier concentration>.

Each doped layer 13A is preferably, for example, an $Al_aGa_bIn_{(1-a-b)}N$ ($0 \leq a < 1$, $0 < b \leq 1$) layer doped with an n-type impurity, and more preferably a GaN layer doped with an n-type impurity.

Concentration of the n-type impurity in each doped layer 13A is not particularly limited, and preferably greater than or equal to $1 \times 10^{17}$ cm$^{-3}$, and more preferably greater than or equal to $2 \times 10^{17}$ cm$^{-3}$ and less than or equal to $1 \times 10^{19}$ cm$^{-3}$. When concentration of the n-type impurity in each doped layer 13A is less than $1 \times 10^{17}$ cm$^{-3}$, a drive voltage of nitride semiconductor light-emitting device 1 can increase.

Thickness of each doped layer 13A is not particularly limited, and preferably greater than or equal to 1.5 nm, and more preferably greater than or equal to 2 nm and less than or equal to 15 nm. When thickness of each doped layer 13A is less than 1.5 nm, deterioration in flatness of long-period superlattice layer 13 can be incurred. Thickness of each doped layer 13A is preferably larger than thickness of later-described barrier layer 15A. In this manner, doped layer 13A is able to function as a hole block layer.

Each undoped layer 13B is preferably, for example, an $In_cGa_{(1-c)}N$ ($0<c\leq1$) layer, and more preferably an $In_cGa_{(1-c)}N$ ($0<c\leq0.3$) layer. When each undoped layer 13B does not contain an n-type impurity, deterioration in flatness of long-period superlattice layer 13 can be prevented, and hence, deterioration in crystallinity of later-described active layer 15 can be prevented. This is because undoped layer 13B is in contact with a lower face of active layer 15. Each undoped layer 13B may contain an n-type impurity.

Thickness of each undoped layer 13B is not particularly limited, and preferably greater than or equal to 0.5 nm and less than or equal to 5 nm. When thickness of each undoped layer 13B is outside this range, deterioration in crystal quality of undoped layer 13B is caused, and thus deterioration in light emission efficiency of nitride semiconductor light-emitting device 1 can be incurred.

By the way, doped layer 13A and undoped layer 13B respectively contain In. Therefore, wavelengths of light respectively emitted by doped layer 13A and undoped layer 13B by photoluminescence are less than or equal to the wavelength of light emitted by later-described active layer 15.

Generally, in a nitride semiconductor light-emitting device, for example, difference in lattice constant between a well layer and an n-type nitride semiconductor layer forming an active layer can lead occurrence of strain, and for avoiding occurrence of strain, a long-period superlattice layer is provided. Therefore, doped layer 13A and undoped layer 13B are preferably made of a semiconductor material that is substantially the same with that of well layer 15B forming active layer 15. Since well layer 15B contains In in many cases, doped layer 13A and undoped layer 13B contain In as described above.

However, when In composition in each of doped layer 13A and undoped layer 13B is too high, the light generated in active layer 15 is absorbed in long-period superlattice layer 13, and thus deterioration in intensity of light outputted from nitride semiconductor light-emitting device 1 can be incurred. For preventing deterioration in intensity, respective band gaps of doped layer 13A and undoped layer 13B are preferably greater than or equal to a band gap of well layer 15B, namely, wavelengths of light emitted respectively by doped layer 13A and undoped layer 13B by photoluminescence are less than or equal to the wavelength of light emitted by active layer 15. More preferably, $0$ nm$\leq(\lambda2-\lambda1)\leq50$ nm is satisfied, and further preferably $1$ nm$\leq(\lambda2-\lambda1)\leq20$ nm is satisfied. Here, $\lambda1$ is the wavelength of light emitted each of doped layer 13A and undoped layer 13B by photoluminescence, and $\lambda2$ is the wavelength of light emitted by active layer 15. When 1 is too short, for example, $(\lambda2-\lambda1)>50$ nm, the aforementioned strain can occur even though long-period superlattice layer 13 is provided. On the other hand, when $\lambda2<\lambda1$, light generated in active layer 15 is absorbed in long-period superlattice layer 13, and as a result, deterioration in intensity of light outputted from nitride semiconductor light-emitting device 1 can be incurred.

<Active Layer>

Active layer 15 may have a single quantum well (SQW) structure, or may have a multiple quantum well (MQW) structure as shown in FIG. 1. When active layer 15 has a MQW structure, active layer 15 is preferably formed by stacking barrier layer 15A and well layer 15B in such a manner that barrier layers 15A sandwich well layer 15B.

Each barrier layer 15A is preferably formed of, for example, an $Al_xGa_yIn_{(1-x-y)}N$ ($0\leq x<1$, $0<y\leq1$) layer. Each barrier layer 15A may not be doped with an n-type impurity, or may be doped with an n-type impurity.

Concentration of the n-type impurity in each barrier layer 15A is not particularly limited, and is preferably less than or equal to $8\times10^{17}$ cm$^{-3}$. When concentration of the n-type impurity in barrier layer 15A exceeds $8\times10^{17}$ cm$^{-3}$, a hole is difficult to be injected into active layer 15 upon application of a voltage across n-side electrode 21 and p-side electrode 25, and hence deterioration in light emission efficiency of nitride semiconductor light-emitting device 1 can be incurred. More preferably, concentration of the n-type impurity in each barrier layer 15A is greater than or equal to $1\times10^{16}$ cm$^{-3}$ and less than or equal to $8\times10^{17}$ cm$^{-3}$.

Thickness of each barrier layer 15A is not limited, and preferably less than or equal to 7 nm, and more preferably greater than or equal to 1.5 nm and less than or equal to 6 nm. When thickness of each barrier layer 15A is less than 1.5 nm, deterioration in crystal quality is caused due to deterioration in flatness of barrier layer 15A, and accordingly, light emission efficiency of nitride semiconductor light-emitting device 1 can be deteriorated. When thickness of each barrier layer 15A is larger than 7 nm, injected carriers are not sufficiently diffused in active layer 15, and increase in drive voltage of nitride semiconductor light-emitting device 1 and deterioration in light emission efficiency thereof can be incurred.

Each well layer 15B is preferably, for example, an $In_zGa_{(1-z)}N$ ($0<z\leq1$) layer, and more preferably a non-doped $In_zGa_{(1-z)}N$ ($0<z\leq0.5$) layer. When each well layer 15B does not contain an n-type impurity, deterioration in flatness of active layer 15 can be prevented, and hence, deterioration in crystallinity of later-described p-type nitride semiconductor layer 17 can be prevented. Each well layer 15B may contain an n-type impurity.

Thickness of each well layer 15B is preferably greater than or equal to 2.5 nm and less than or equal to 7 nm without limited to this range. When thickness of each well layer 15B is outside this range, deterioration in light emission efficiency of nitride semiconductor light-emitting device 1 and increase in drive voltage thereof can be incurred.

The number of layers of well layer 15B is not particularly limited, and two or more layers are preferred. As a result, it is possible to decrease a current density of active layer 15. Therefore, even when nitride semiconductor light-emitting device 1 is driven at a large current, decrease in quantity of heat generated in active layer 15 can be achieved, and overflow of carriers from active layer 15 can be prevented. Therefore, occurrence of non-light-emitting recombination in a layer other than active layer 15 can be prevented.

<P-Type Nitride Semiconductor Layer>

P-type nitride semiconductor layer 17 is preferably, for example, an $Al_{s4}Ga_{t4}In_{u4}N$ ($0\leq s4\leq1$, $0\leq t4\leq1$, $0\leq u4\leq1$, $s4+t4+u4\neq0$) layer doped with a p-type impurity, and more preferably an $Al_{s4}Ga_{1-s4}N$ ($0<s4\leq0.4$, preferably $0.1\leq s4\leq0.3$) layer doped with a p-type dopant.

The p-type impurity is not particularly limited, and is, for example, magnesium.

Concentration of the p-type impurity in p-type nitride semiconductor layer 17 is not particularly limited, and preferably greater than or equal to $1\times10^{18}$ cm$^{-3}$ and less than or equal to $2\times10^{20}$ cm$^{-3}$.

Thickness of p-type nitride semiconductor layer 17 is not particularly limited, and greater than or equal to 10 nm and less than or equal to 200 nm.

<N-Side Electrode, Transparent Electrode, and p-Side Electrode>

N-side electrode 21 and p-side electrode 25 are electrodes for supplying nitride semiconductor light-emitting device 1 with driving power, and are preferably formed, for example, by sequentially stacking a nickel layer, a platinum layer and a gold layer in this order, and preferably have a thickness of greater than or equal to 300 nm and less than or equal to 3000 nm in total. Transparent electrode 23 is preferably made of, for example, gold, palladium, nickel, ITO (Indium Tin Oxide) or IZO (Indium Zinc Oxide), and preferably has a thickness of greater than or equal to 50 nm and less than or equal to 500 nm. A reflecting electrode of aluminum, silver or the like may be stacked in place of transparent electrode 23, and the reflecting electrode may be flip-chip mounted.

<Average Carrier Concentration>

An average carrier concentration of long-period superlattice layer 13 is higher than an average carrier concentration of active layer 15, and preferably greater than or equal to 1.1 times the average carrier concentration of active layer 15, and more preferably greater than or equal to 1.2 times and less than or equal to 100 times the average carrier concentration of active layer 15. When the average carrier concentration of long-period superlattice layer 13 is less than 1.2 times the average carrier concentration of active layer 15, deterioration in light emission efficiency at the time of driving at a large current cannot be prevented. On the other hand, when the average carrier concentration of long-period superlattice layer 13 exceeds 100 times the average carrier concentration of active layer 15, deterioration in flatness of long-period superlattice layer 13 is incurred, and deterioration in crystal quality of active layer 15 is incurred, and thus light emission efficiency of nitride semiconductor light-emitting device 1 can be deteriorated.

A carrier concentration means a concentration of electron or hole, and is not determined only by an amount of the doped n-type impurity or an amount of the doped p-type impurity. In other words, the carrier concentration of long-period superlattice layer 13 is not determined only by an amount of the n-type impurity doped to long-period superlattice layer 13, and the carrier concentration of active layer 15 is not determined only by an amount of the n-type impurity doped to active layer 15. Such a carrier concentration is calculated according to a result of capacitance versus voltage characteristic (hereinafter, also referred to as "C-V characteristic". C-V is an abbreviation for Capacitance-Voltage.) of nitride semiconductor light-emitting device 1 as shown below, and indicates the carrier concentration in the condition that a current is not injected, and is a sum of carriers generated from an ionized impurity, a crystal defect serving as a donor, or a crystal defect serving as an acceptor.

Near PN junction of nitride semiconductor light-emitting device 1 (concretely, near interface between active layer 15 and p-type nitride semiconductor layer 17), there is a depletion layer. Since the depletion layer is electrically insulated, when a DC voltage is applied across n-side electrode 21 and p-side electrode 25, a virtual capacitor using the depletion layer as a dielectric layer is formed. Accordingly, when a DC voltage is applied across n-side electrode 21 and p-side electrode 25, and depletion layer capacitance C is measured, namely C-V characteristic of nitride semiconductor light-emitting device 1 is examined, thickness x of a depletion layer is calculated from the following Formula 1.

$$x = \in_0 \in_r / C \qquad \text{Formula 1}$$

In Formula 1, x represents thickness (cm) of a depletion layer, and $\in_0$ represents vacuum permittivity ($8.9 \times 10^{-14}$ (F/cm)). $\in_r$ represents specific permittivity (unit is non-dimensional unit) of a nitride semiconductor material, and can be approximated by specific permittivity of GaN. C represents measured depletion layer capacitance (F/cm$^2$).

When the magnitude of the voltage applied to nitride semiconductor light-emitting device 1 changes, thickness of the depletion layer changes, and hence capacitance of the depletion layer changes. Here, carrier concentration N in the bottom face of the depletion layer (face of the depletion layer positioned on the side of substrate 3) is represented by the following Formula 2. Therefore, depletion layer capacitance C is measured with various magnitudes of voltage V applied to nitride semiconductor light-emitting device 1, and carrier concentration N in the bottom face of the depletion layer is calculated by the following Formula 2.

$$N = C^3 / \{q \in_0 \in_r (\Delta C / \Delta V)\} \qquad \text{Formula 2}$$

In Formula 2, N represents carrier concentration (1/cm$^3$) in the bottom face of the depletion layer, q represents point charge amount (C), $\Delta C$ represents a variation in depletion layer capacitance when magnitude of voltage V applied to nitride semiconductor light-emitting device 1 is changed, and $\Delta V$ represents a variation in voltage V applied to nitride semiconductor light-emitting device 1. C, $\in_0$ and $\in_r$ in Formula 2 are as same as those in Formula 1.

From the above, by measuring depletion layer capacitance C with various magnitudes of voltage V applied to nitride semiconductor light-emitting device 1, relationship between thickness x of the depletion layer and carrier concentration N in the bottom face of the depletion layer can be elucidated. Here, in nitride semiconductor light-emitting device 1, both thickness of active layer 15 and thickness of long-period superlattice layer 13 are known. Therefore, in which one of active layer 15 and long-period superlattice layer 13 the bottom face of the depletion layer is present can be found by knowing thickness of the depletion layer. By examining C-V characteristics with various applied voltages, carrier concentrations at various points in the thick direction of active layer 15 and long-period superlattice layer 13 can be calculated. Then, by averaging the calculated carrier concentrations, an average carrier concentration of active layer 15 and an average carrier concentration of long-period superlattice layer 13 can be obtained.

When a nitride semiconductor light-emitting device where the average carrier concentration of a long-period superlattice layer is not controlled as is the case of the present embodiment is driven at a large current, the operation voltage increases, and light emission efficiency can be deteriorated. As a reason for that, thickness of a barrier layer forming an active layer is large, a total volume where the n-type impurity or the p-type impurity is doped in a nitride semiconductor light-emitting device is small, many layers where concentration of the n-type impurity or the p-type impurity is low are provided, or concentrations of the n-type impurity or the p-type impurity in the plural barrier layers forming the active layer are substantially identical can be supposed.

Also, Japanese Patent Laying-Open No. 2000-349337 proposes a technique of making concentration of the n-type impurity in an active layer relatively high on the n-layer side. However, even when concentration of the n-type impurity is relatively high on the n layer side, it is difficult to inject carriers into the active layer unless the carrier concentration is relatively high on the n layer side. Therefore, it is difficult to make a series resistance component of the active layer sufficiently small.

On the other hand, in nitride semiconductor light-emitting device 1 according to the present embodiment, the average carrier concentration of long-period superlattice layer 13 is higher than the average carrier concentration of active layer 15. In the present embodiment, since long-period superlattice layer 13 and active layer 15 contain an n-type impurity, the average electron concentration of long-period superlattice layer 13 is higher than the average electron concentration of active layer 15. Therefore, it is possible to suppress diffusion of holes to long-period superlattice layer 13 from p-type nitride semiconductor layer 17. Therefore, even when long-period superlattice layer 13 includes plenty of crystal defects, occurrence of non-light-emitting recombination in a crystal defect in long-period superlattice layer 13 can be prevented. Therefore, it is possible to prevent deterioration in light emission efficiency.

In nitride semiconductor light-emitting device 1 according to the present embodiment, since the carrier concentration of active layer 15 is low, injected holes are likely to diffuse in the entire active layer 15, and hence local increase in the hole concentration is less likely to occur. Therefore, occurrence of Auger recombination in active layer 15 can be prevented. Also in this point, deterioration in light emission efficiency can be prevented.

In the present embodiment, since occurrence of non-light-emitting recombination in a crystal defect in long-period superlattice layer 13 can be prevented, consumption of carriers due to non-light-emitting recombination in long-period superlattice layer 13 can be prevented. Therefore, by application of voltage to n-side electrode 21 and p-side electrode 25, sufficient quantity of injected carriers (electrons in the present embodiment) is supplied from long-period superlattice layer 13 to active layer 15. Therefore, a series resistance component of active layer 15 can be decreased, and hence even when nitride semiconductor light-emitting device 1 is driven at a large current, increase in operation voltage can be prevented, and heat generation at the time of driving at a large current can be suppressed. Therefore, increase in temperature near PN junction can be prevented, so that it is possible to prevent carriers from overflowing from active layer 15 due to increase in heat energy. As a result, occurrence of non-light-emitting recombination in a layer other than active layer 15 can be prevented, and hence deterioration in light emission efficiency at the time of driving at a large current can be prevented. As just described, in the present embodiment, since increase in operation voltage and deterioration in light emission efficiency at the time of driving at a large current can be prevented, deterioration in power efficiency at the time of driving at a large current can be prevented.

As a method of making the average carrier concentration of long-period superlattice layer 13 higher than the average carrier concentration of active layer 15, several methods can be supposed. For example, the proportion of thickness per one layer of doped layer 13A to thickness per one period of long-period superlattice layer 13 is made higher than the proportion of thickness per one layer of barrier layer 15A to thickness per one period of active layer 15. As a result, the proportion of a total volume of doped layer 13A to a total volume of long-period superlattice layer 13 is higher than the proportion of a total volume of barrier layer 15A to a total volume of active layer 15. In other words, the proportion of a total volume of layers containing the n-type impurity to a total volume of long-period superlattice layer 13 is higher than a total volume of layers containing the n-type impurity to a total volume of active layer 15. Therefore, even when concentration of the n-type impurity in doped layer 13A is substantially equal to concentration of the n-type impurity in barrier layer 15A, the average carrier concentration of long-period superlattice layer 13 is higher than the average carrier concentration of active layer 15. Therefore, since flatness of doped layer 13A can be maintained, deterioration in crystallinity of active layer 15 can be prevented, and hence deterioration in light emission efficiency in active layer 15 can be prevented.

Thickness of each doped layer 13A is preferably greater than or equal to thickness of each barrier layer 15A. In this manner, it is possible to prevent holes from diffusing in long-period superlattice layer 13, and even when nitride semiconductor light-emitting device 1 is driven at a high temperature, deterioration in light emission efficiency is unlikely to occur. Therefore, characteristics at high temperatures of nitride semiconductor light-emitting device 1 are improved.

When undoped layer 13B and well layer 15B contain the n-type impurity, it is preferred to adjust a doping amount so that the average carrier concentration of long-period superlattice layer 13 is higher than the average carrier concentration of active layer 15.

A proportion of thickness per one layer of doped layer 13A to thickness per one period of long-period superlattice layer 13 is preferably more than once, and more preferably greater than or equal to 1.2 times and less than or equal to 5 times, a proportion of thickness per one layer of barrier layer 15A to thickness per one period of active layer 15. When the proportion of thickness per one layer of doped layer 13A to thickness per one period of long-period superlattice layer 13 is once or less the proportion of thickness per one layer of barrier layer 15A to thickness per one period of active layer 15, it can be difficult to make the average carrier concentration of long-period superlattice layer 13 higher than the average carrier concentration of active layer 15, and hence, increase in drive voltage of nitride semiconductor light-emitting device 1 can be incurred. When the present embodiment is combined with at least one of the first modified example, the second modified example, and the later-described second embodiment, the proportion of thickness per one layer of doped layer 13A to thickness per one period of long-period superlattice layer 13 should be once or more the proportion of thickness per one layer of barrier layer 15A to thickness per one period of active layer 15.

Preferably, long-period superlattice layer 13 has two or more layers of doped layer 13A. As a result, the total volume of layers containing the n-type impurity of the layers forming long-period superlattice layer 13 can be made large without significantly increasing concentration of the n-type impurity in each doped layer 13A. Therefore, it is possible to make the average carrier concentration of long-period superlattice layer 13 higher than the average carrier concentration of active layer 15 without causing deterioration in flatness of long-period superlattice layer 13. This reveals that it is more preferred to provide doped layer 13A as a constituent of a laminated structure (for example, superlattice structure) than providing doped layer 13A as a monolayer.

As described in the above <Short-period superlattice layer>, it is preferred that concentration of the n-type impurity in each of first semiconductor layer 11A and second semiconductor layer 11B of short-period superlattice layer 11 is greater than or equal to $1 \times 10^{18}$ cm$^{-3}$ and less than or equal to $5 \times 10^{19}$ cm$^{-3}$. The higher the carrier concentration, the smaller the amount of extension of the depletion layer (the smaller the depth of the depletion layer). Therefore, it is supposed that the depletion layer is unlikely to extend in short-period superlattice layer 11. Therefore, when an inversely-biased current is applied to nitride semiconductor light-emitting device 1, or when a positively-biased excess current is applied to nitride semiconductor light-emitting device 1, it is possible to prevent the depletion layer from extending on the side of substrate 3 from short-period superlattice layer 11. Therefore, the applied inversely-biased current or the applied positively-biased current is quickly discharged, so that occurrence of electrostatic destruction in nitride semiconductor light-emitting device 1 can be prevented.

In the present embodiment, long-period superlattice layer 13 may be provided between active layer 15 and p-type nitride semiconductor layer 17 instead of being provided between short-period superlattice layer 11 and active layer 15. At this time, doped layer 13A should contain a p-type impurity rather than an n-type impurity. In this way, the aforementioned effect can be obtained.

Also, long-period superlattice layer 13 may be provided between active layer 15 and p-type nitride semiconductor layer 17, as well as between short-period superlattice layer 11 and active layer 15. In a long-period superlattice layer provided between active layer 15 and p-type nitride semiconductor layer 17, doped layer 13A should contain a p-type impurity rather than an n-type impurity. In this way, deterioration in power efficiency at the time of driving at a large current can be further prevented.

Concrete methods of making the average carrier concentration of long-period superlattice layer 13 higher than the average carrier concentration of active layer 15 are not limited to the method in the present embodiment. For example, according to any one of methods in a later-described first modified example, a later-described second modified example and a later-described second embodiment, the average carrier concentration of long-period superlattice layer 13 may be made higher than the average carrier concentration of active layer 15. Further, the present embodiment, the later-described first modified example, the later-described second modified example and the later-described second embodiment may be appropriately combined.

Nitride semiconductor light-emitting device 1 according to the present embodiment is preferably produced according to at least one method of a production method in a later-described third modified example and a production method in a later-described fourth modified example. As a result, crystallinity of active layer 15 is improved, and light emission efficiency is further improved.

<First Modified Example>

In the first modified example, when both undoped layer 13B and well layer 15B do not contain an n-type impurity, the proportion of thickness per one layer of undoped layer 13B to thickness per one period of long-period superlattice layer 13 is made lower than the proportion of thickness per one layer of well layer 15B to thickness per one period of active layer 15. As a result, the proportion of a total volume of undoped layer 13B to a total volume of long-period superlattice layer 13 is lower than the proportion of a total volume of well layer 15B to a total volume of active layer 15. That is, the proportion of a total volume of layers not containing an n-type impurity to a total volume of long-period superlattice layer 13 is lower than the proportion of a total volume of layers not containing an n-type impurity to a total volume of active layer 15. As a result, the proportion of a total volume of layers containing an n-type impurity to a total volume of long-period superlattice layer 13 is higher than the proportion of a total volume of layers containing an n-type impurity to a total volume of active layer 15. Therefore, even when concentration of the n-type impurity in doped layer 13A is substantially the same with concentration of the n-type impurity in barrier layer 15A, the average carrier concentration of long-period superlattice layer 13 is higher than the average carrier concentration of active layer 15. Therefore, likewise the foregoing first embodiment, flatness of doped layer 13A can be maintained, and deterioration in crystallinity of active layer 15 can be prevented, and hence deterioration in light emission efficiency in active layer 15 can be prevented.

A proportion of thickness per one layer of undoped layer 13B to thickness per one period of long-period superlattice layer 13 is preferably smaller than once, and more preferably greater than or equal to 0.4 time and less than or equal to 0.95 time the proportion of thickness per one layer of well layer 15B to thickness per one period of active layer 15. When the proportion of thickness per one layer of undoped layer 13B to thickness per one period of long-period superlattice layer 13 is once or more the proportion of thickness per one layer of well layer 15B to thickness per one period of active layer 15, it can be difficult to make the average carrier concentration of long-period superlattice layer 13 higher than the average carrier concentration of active layer 15. When the present modified example is combined with at least one of the foregoing first embodiment, the later-described second modified example and the later-described second embodiment, the proportion of thickness per one layer of undoped layer 13B to thickness per one period of long-period superlattice layer 13 should be once or less the proportion of thickness per one layer of well layer 15B to thickness per one period of active layer 15.

<Second Modified Example>

In the second modified example, concentration of the n-type impurity in doped layer 13A is higher than concentration of the n-type impurity in barrier layer 15A. As a result, the proportion of the ionized impurity is higher in doped layer 13A than in barrier layer 15A. Therefore, the average carrier concentration of long-period superlattice layer 13 is higher than the average carrier concentration of active layer 15.

Concentration of the n-type impurity in doped layer 13A is preferably more than once concentration of the n-type impurity in barrier layer 15A. Preferably, concentration of the n-type impurity in doped layer 13A is greater than or equal to 1.2 times and less than or equal to 1000 times concentration of the n-type impurity in barrier layer 15A, or less than or equal to $2 \times 10^{19}$ cm$^{-3}$. When concentration of the n-type impurity in doped layer 13A is less than once concentration of the n-type impurity in barrier layer 15A, it can be difficult to make the average carrier concentration of long-period superlattice layer 13 higher than the average carrier concentration of active layer 15. On the other hand, when concentration of the n-type impurity in doped layer 13A exceeds 1000 times concentration of the n-type impurity in barrier layer 15A, or concentration of the n-type impurity in doped layer 13A exceeds $2 \times 10^{19}$ cm$^{-3}$, deterioration in flatness of doped layer 13A is caused, and deterioration in crystallinity of active layer 15 is caused, and deterioration in light emission efficiency in active layer 15 can be caused. When the present modified example is combined with at least one of the foregoing first embodiment, the foregoing first modified example, and the later-described second embodiment, concentration of the n-type impurity in doped layer 13A should be once or more concentration of the n-type impurity in barrier layer 15A.

<Second Embodiment>

In the second embodiment of the present invention, since the production condition differs between long-period superlattice layer 13 and active layer 15, the average carrier concentration differs between long-period superlattice layer 13 and active layer 15. In the following, growing methods of long-period superlattice layer 13 and active layer 15 will be mainly shown.

First, on an upper face of substrate 3, buffer layer 5, base layer 7, n-type nitride semiconductor layer 9, and short-period superlattice layer 11 are sequentially crystal-grown. Conditions of crystal growth such as a material for use in film formation, a film forming temperature, and a film forming time may be appropriately set depending on the material, thickness and so on of the layer to be grown.

Next, on an upper face of short-period superlattice layer 11, long-period superlattice layer 13 is crystal-grown.

At this time, the growth rate of doped layer 13A is preferably greater than or equal to 10 nm/hour and less than or equal to 300 nm/hour. When the growth rate of doped layer 13A is less than 10 nm/hour, the growth time of doped layer 13A is prolonged, and thus the amount of material used for growth of doped layer 13A is increased, so that productivity of nitride semiconductor light-emitting device 1 may be deteriorated. On the other hand, when the growth rate of doped layer 13A exceeds 300 nm/hour, deterioration in light emission efficiency of nitride semiconductor light-emitting device 1 due to deterioration in crystal quality of doped layer 13A can be incurred. The growth rate of undoped layer 13B is preferably greater than or equal to 10 nm/hour and less than or equal to 300 nm/hour, and more preferably equal to the growth rate of doped layer 13A.

The growth temperature of long-period superlattice layer 13 may be equivalent with the growth temperature of active layer 15, and may be a temperature that is 30° C. higher than the growth temperature of active layer 15. When the growth temperature of long-period superlattice layer 13 is lower than the growth temperature of active layer 15, deterioration in light emission efficiency of nitride semiconductor light-emitting device 1 due to deterioration in crystal quality of active layer 15 can be incurred. On the other hand, when the growth temperature of long-period superlattice layer 13 is too high, a band gap of undoped layer 13B is too large and strain relaxing function that is an original function of long-period superlattice layer 13 may not be exerted.

Subsequently, on an upper face of long-period superlattice layer 13, active layer 15 is crystal-grown.

At this time, the growth rate of barrier layer 15A is preferably greater than or equal to 10 nm/hour and less than or equal to 300 nm/hour, and may be equal to the growth rate of doped layer 13A. When the growth rate of barrier layer 15A is less than 10 nm/hour, the growth time of barrier layer 15A is prolonged, and thus the amount of material used for growth of barrier layer 15A is increased, so that productivity of nitride semiconductor light-emitting device 1 may be deteriorated. On the other hand, when the growth rate of barrier layer 15A exceeds 300 nm/hour, deterioration in light emission efficiency of nitride semiconductor light-emitting device 1 due to deterioration in crystal quality of barrier layer 15A can be incurred.

On the other hand, the growth rate of well layer 15B is preferably lower than the respective growth rates of doped layer 13A, undoped layer 13B and barrier layer 15A. For example, the growth rate of well layer 15B is preferably greater than or equal to 10 nm/hour and less than or equal to 150 nm/hour, and more preferably greater than or equal to 20 nm/hour and less than or equal to 100 nm/hour. As a result, well layer 15B is superior in crystallinity to doped layer 13A, undoped layer 13B and barrier layer 15A, and hence, it is possible to provide nitride semiconductor light-emitting device 1 having excellent light emission efficiency.

The growth temperature of active layer 15 is preferably greater than or equal to 600° C. and less than or equal to 1000° C. When the growth temperature of active layer 15 is less than 600° C., crystallinity of active layer 15 is poor, and deterioration in light emission efficiency of nitride semiconductor light-emitting device 1 can be incurred. On the other hand, when the growth temperature of active layer 15 exceeds 1000° C., In is not sufficiently incorporated into active layer 15, and hence a desired light emission wavelength may not be obtained.

Subsequently, on an upper face of active layer 15, p-type nitride semiconductor layer 17 is crystal-grown. Then, p-type nitride semiconductor layer 17, active layer 15, long-period superlattice layer 13, short-period superlattice layer 11, and n-type nitride semiconductor layer 9 are etched so that a part of n-type nitride semiconductor layer 9 is exposed. On an upper face of n-type nitride semiconductor layer 9 exposed as a result of etching, n-side electrode 21 is formed, and on an upper face of p-type nitride semiconductor layer 17, p-side electrode 25 is formed with transparent electrode 23 interposed therebetween. In this manner, nitride semiconductor light-emitting device 1 is fabricated.

As described above, in the present embodiment, it is preferred that the respective growth rates of doped layer 13A, undoped layer 13B and barrier layer 15A are faster than the growth rate of well layer 15B. Accordingly, there are more crystal defects in doped layer 13A, undoped layer 13B and barrier layer 15A than in well layer 15B. These crystal defects play a role of a donor, and are necessary for efficiently injecting carriers into well layer 15B. These crystal defects exist abundantly in long-period superlattice layer 13 containing both doped layer 13A and undoped layer 13B than in active layer 15. Therefore, the average carrier concentration of long-period superlattice layer 13 is higher than the average carrier concentration of active layer 15.

Conventionally, the optimum growth rate of each of an active layer and a long-period superlattice layer is believed to be a rate where crystal defects are reduced. However, as a result of diligent examination made by the present inventor et al., it was revealed that as to a long-period superlattice layer, a carrier is more likely to occur when the growth rate is made faster and there are somewhat many crystal defects. From a similar reason, occurrence of non-light-emitting recombination in nitride semiconductor light-emitting device 1 can be suppressed even when a crystal defect exists in barrier layer 15A although it does not exist in well layer 15B, and this is found to be desired because driving voltage of nitride semiconductor light-emitting device 1 is reduced.

Specifically, the reason of providing long-period superlattice layer 13 is to avoid occurrence of stain as described in <Long-period superlattice layer> in the foregoing first embodiment, and to prevent deterioration in power efficiency at the time of driving at a large current by introducing a carrier into active layer 15 at the time of driving at a current.

For avoiding occurrence of strain, as described in <Long-period superlattice layer> in the foregoing first embodiment, it is preferred to grow undoped layer 13B of long-period superlattice layer 13 with a composition similar to that of well layer 15B of active layer 15. On the other hand, for introducing a carrier into active layer 15, it is preferred that long-period superlattice layer 13 has many donor levels. In the present embodiment, the respective growth rates of doped layer 13A, undoped layer 13B and barrier layer 15A are faster than the growth rate of well layer 15B. Therefore, crystal defects originating from a donor in long-period superlattice layer 13 are more than crystal defects originating from a donor in active layer 15. When the crystal defects originating from a donor increase, occurrence of non-light-emitting recombination is induced, and deterioration in light emission efficiency may be incurred. However, as described above, the average carrier density (electron density in the present embodiment) of long-period superlattice layer 13 in the present embodiment is high. Therefore, it is possible to prevent holes from diffusing to long-period superlattice layer 13. Therefore, a crystal defect originating from a donor in long-period superlattice layer 13 will rarely act as the center of non-light-emitting recombination, but will act as a donor supply source for supplying active layer 15 with a donor.

Also, when the respective growth rates of doped layer 13A, undoped layer 13B and barrier layer 15A are made faster than the growth rate of well layer 15B as is the case of the present embodiment, the time required for growth (growth time) of doped layer 13A, undoped layer 13B and barrier layer 15A can be shortened, and also the material can be reduced. Therefore, it is possible to reduce the production cost of the nitride semiconductor light-emitting device. This effect is particularly significant when a film formation treatment is executed concurrently on a plurality of substrates having a large bore (a bore of greater than or equal to 6 inches).

In the present embodiment, when doped layer 13A, undoped layer 13B, barrier layer 15A and well layer 15B contain In, it is preferred to crystal-grow doped layer 13A, undoped layer 13B, barrier layer 15A and well layer 15B while adjusting a supply amount of TMI (trimethyl indium) gas. As a result, wavelengths of light emitted respectively by doped layer 13A and undoped layer 13B by photoluminescence can be made less than or equal to the wavelength of light emitted by active layer 15.

Also, in the present embodiment, a method for crystal growth of long-period superlattice layer 13 or the like is not particularly limited. When long-period superlattice layer 13 or the like is crystal-grown using a source gas and a carrier gas, for example, when crystal is grown according to MOCVD (Metal Organic Chemical Vapor Deposition) method, it is preferred to produce a nitride semiconductor light-emitting device according to the method as shown in the later-described third modified example. As a result, crystallinity of active layer 15 is further improved, and light emission efficiency is further improved.

When the present embodiment is combined with at least one of the foregoing embodiment, the foregoing first modified example and the foregoing second modified example, the respective growth rates of doped layer 13A, undoped layer 13B and barrier layer 15A may be the same with the growth rate of well layer 15B.

<Third Modified Example>

In the third modified example, doped layer 13A of long-period superlattice layer 13 is grown using a carrier gas containing greater than or equal to 0.3% by volume and less than or equal to 30% by volume hydrogen gas. In the following, difference from the foregoing second embodiment will be mainly shown.

According to the method shown in the foregoing second embodiment, buffer layer 5, base layer 7, n-type nitride semiconductor layer 9, and short-period superlattice layer 11 are sequentially crystal-grown on an upper face of substrate 3.

Next, on an upper face of short-period superlattice layer 11, long-period superlattice layer 13 is crystal-grown. At this time, when doped layer 13A of long-period superlattice layer 13 is crystal grown, it is preferred to use nitrogen gas and greater than or equal to 0.3% by volume and less than or equal to 30% by volume of hydrogen gas as a carrier gas. On the other hand, when undoped layer 13B of long-period superlattice layer 13 is grown, it is preferred to use nitrogen gas as a carrier gas. The source gas may be appropriately selected depending on respective compositions of doped layer 13A and undoped layer 13B.

Further, since doped layer 13A of long-period superlattice layer 13 is grown using a carrier gas containing greater than or equal to 0.3% by volume and less than or equal to 30% by volume of hydrogen gas, crystal quality of doped layer 13A is improved in comparison with the case where doped layer 13A is grown using only nitrogen gas as a carrier gas, and flat doped layer 13A is more likely to grow. Therefore, flatness of the upper face of long-period superlattice layer 13 is improved in comparison with the case where the nitride semiconductor light-emitting device is fabricated according to the production method in the foregoing second embodiment. Therefore, crystallinity of active layer 15 is improved, and light emission efficiency is further improved.

Subsequently, on an upper face of long-period superlattice layer 13, active layer 15 is crystal-grown. At this time, it is preferred to use nitrogen gas and hydrogen gas as a carrier gas in growing barrier layer 15A of active layer 15. Also, it is preferred to use nitrogen gas as a carrier gas in growing well layer 15B of active layer 15. The source gas may be appropriately selected depending on the respective compositions of barrier layer 15A and well layer 15B.

Subsequently, according to the method shown in the foregoing second embodiment, on an upper face of active layer 15, p-type nitride semiconductor layer 17 is crystal-grown, and p-type nitride semiconductor layer 17, active layer 15, long-period superlattice layer 13, short-period superlattice layer 11, and n-type nitride semiconductor layer 9 are etched, and on an upper face of n-type nitride semiconductor layer 9 exposed as a result of etching, n-side electrode 21 is formed, and on an upper face of p-type nitride semiconductor layer 17, p-side electrode 25 is formed with transparent electrode 23 interposed therebetween.

<Fourth Modified Example>

In the fourth modified example, long-period superlattice layer 13 is grown while setting the growth temperature of long-period superlattice layer 13 higher than the growth temperature of active layer 15. In the following, difference from the foregoing second embodiment will be mainly shown.

According to the method shown in the foregoing embodiment, buffer layer 5, base layer 7, n-type nitride semiconductor layer 9, and short-period superlattice layer 11 are sequentially crystal-grown on an upper face of substrate 3. Then, on an upper face of short-period superlattice layer 11, long-period superlattice layer 13 is crystal-grown.

At this time, the growth temperature of long-period superlattice layer 13 is set higher than the growth temperature of active layer 15 that is fabricated in the subsequent step. Concretely, it is preferred that the growth temperature of long-period superlattice layer 13 is set higher than the growth temperature of active layer 15 by greater than or equal to 3° C. and less than or equal to 30° C. As a result, In composition of undoped layer 13B is decreased, and crystal quality of undoped layer 13B is improved. Therefore, flatness of the upper face of long-period superlattice layer 13 is improved in comparison with the case where a nitride semiconductor light-emitting device is fabricated according to the production method in the foregoing second embodiment. Therefore, crystallinity of active layer 15 is improved, and light emission efficiency is further improved.

Next, according to the method shown in the foregoing second embodiment, on an upper face of long-period superlattice layer 13, active layer 15 and p-type nitride semiconductor layer 17 are crystal-grown, and p-type nitride semiconductor layer 17, active layer 15, long-period superlattice layer 13, short-period superlattice layer 11, and n-type nitride semiconductor layer 9 are etched, and on an upper face of n-type nitride semiconductor layer 9 exposed as a result of etching, n-side electrode 21 is formed, and on an upper face of p-type nitride semiconductor layer 17, p-side electrode 25 is formed with transparent electrode 23 interposed therebetween.

EXAMPLES

In the following, examples of the present invention will be shown. The present invention is not limited to the examples as shown below.
<Fabrication of Nitride Semiconductor Light-Emitting Device>

Example 1

First, a sapphire substrate having an convexoconcave-worked upper face was prepared, and on the upper face, a buffer layer formed of AlN, a base layer formed of non-doped GaN, an n-type contact layer formed of n-type GaN, an n-type clad layer formed of n-type GaN were sequentially crystal-grown. At this time, thickness of the n-type clad layer was 1 µm, and concentration of the n-type impurity in the n-type clad layer was $6 \times 10^{18}$ cm$^{-3}$.

Next, the temperature of a film forming device was set at 880° C., and a short-period superlattice layer was crystal-grown. Concretely, a first semiconductor layer formed of Si-doped GaN and a second semiconductor layer formed of non-doped InGaN were alternately crystal-grown periodically 20 times.

The first semiconductor layer was crystal-grown by using TMG (trimethyl gallium) gas and NH$_3$ gas as a source gas, and nitrogen gas as a carrier gas. Thickness of each first semiconductor layer was 1.75 nm, and concentration of Si in each first semiconductor layer was $3 \times 10^{18}$ cm$^{-3}$.

The second semiconductor layer was crystal-grown by using TMI gas and NH$_3$ gas as a source gas and nitrogen gas as a carrier gas. Thickness of each second semiconductor layer was 1.75 nm. Since the flow rate of TMI was adjusted so that the wavelength of the light emitted by the second semiconductor layer by photoluminescence was 375 nm, composition of In in each second semiconductor layer was 2%. Carriers were diffused in the first semiconductor layer and the second semiconductor layer and averaged, and the average carrier concentration of the short-period superlattice layer was about $1.5 \times 10^{18}$ cm$^{-3}$.

Next, the temperature of the film forming device was decreased to 855° C., and a long-period superlattice layer was crystal-grown. Concretely, a doped layer formed of Si-doped GaN and an undoped layer formed of non-doped InGaN were alternately crystal-grown periodically three times.

A doped layer was crystal-grown by using TMG gas and NH$_3$ gas as a source gas and nitrogen gas and hydrogen gas as a carrier gas. The growth rate of each doped layer was 100 nm/hour. Thickness of each doped layer was 5 nm, and concentration of Si in each doped layer was $3.4 \times 10^{17}$ cm$^{-3}$.

An undoped layer was crystal-grown by using TMI gas and NH$_3$ gas as a source gas and nitrogen gas as a carrier gas. The growth rate of each undoped layer was 100 nm/hour. Thickness of each undoped layer was 3.5 nm. Further, since the flow rate of TMI was adjusted so that the wavelength of the light emitted by the undoped layer by photoluminescence was 448 nm, composition of In in each undoped layer was 22%. Carriers were diffused in the doped layer and the undoped layer and averaged, and the average carrier concentration of the long-period superlattice layer was about $2.6 \times 10^{17}$ cm$^{-3}$.

Next, the temperature of the film forming device was decreased to 850° C., and an active layer was crystal-grown. Concretely, a barrier layer formed of Si-doped GaN and a well layer formed of non-doped InGaN were alternately crystal-grown periodically three times.

A barrier layer was crystal-grown by using TMG gas and NH$_3$ gas as a source gas and nitrogen gas and hydrogen gas as a carrier gas. The growth rate of each barrier layer was set at 100 nm/hour. Thickness of each barrier layer was 5 nm, and concentration of Si in each barrier layer was $3.4 \times 10^{17}$ cm$^{-3}$.

A well layer was crystal-grown by using TMI gas and NH$_3$ gas as a source gas and nitrogen gas as a carrier gas. The growth rate of each well layer was set at 52 nm/hour. Thickness of each well layer was 3.5 nm. Further, since the flow rate of TMI was adjusted so that the wavelength of the light emitted by the well layer by photoluminescence was 450 nm, composition of In in each well layer was set at 25%. Carriers were diffused in the barrier layer and the well layer and averaged, and the average carrier concentration of the active layer was about $2 \times 10^{17}$ cm$^{-3}$.

Next, on an upper face of the well layer, an uppermost barrier layer formed of non-doped GaN of 10 nm thick was crystal-grown.

Next, the temperature of the film forming device was increased, and on an upper face of the uppermost barrier layer, a p-type AlGaN layer, a p-type GaN layer and a p-type high-doped contact layer were crystal-grown.

Then, a p-type high-doped contact layer, a p-type GaN layer, a p-type AlGaN layer, an active layer, a long-period superlattice layer, a short-period superlattice layer, an n-type clad layer, and an n-type contact layer were etched so that a part of the n-type contact layer was exposed. On an upper face of the n-type contact layer exposed as a result of etching, an n-side electrode formed of Au was formed. On an upper face of the p-type high-doped contact layer, a transparent electrode formed of ITO and a p-side electrode formed of Au were sequentially formed. In this way, the nitride semiconductor light-emitting device according to Example 1 was fabricated.

Light output of the obtained nitride semiconductor light-emitting device was 45 mW, 2.9 V at 30 mA.

Example 2

A nitride semiconductor light-emitting device according to Example 2 was produced according to a method similar to that of Example 1 except that the proportion of thickness per one layer of the doped layer formed of Si-doped GaN to thickness per one period of the long-period superlattice layer was made high. In the following, difference from the foregoing Example 1 will be mainly shown.

Concretely, according to a method similar to that of Example 1, a buffer layer, a base layer, an n-type contact layer, an n-type clad layer, and a short-period superlattice layer were crystal-grown on an upper face of a sapphire substrate.

Next, the temperature of the film forming device was set at 855° C., and a long-period superlattice layer was crystal-grown. Concretely, a doped layer formed of Si-doped GaN and an undoped layer formed of non-doped InGaN were alternately crystal-grown periodically three times. At this time, the growth time of the doped layer was adjusted so that thickness of each doped layer was 6.5 nm. Carriers were diffused in the doped layer and the undoped layer and averaged, and the average carrier concentration of the long-period superlattice layer was about $2.9 \times 10^{17}$ cm$^{-3}$.

Subsequently, according to a method similar to that of Example 1, an active layer, a p-type AlGaN layer, a p-type GaN layer and a p-type high-doped contact layer were sequentially crystal-grown on an upper face of the long-period superlattice layer, and an n-side electrode, a transparent electrode, and a p-side electrode were fabricated. In this manner, the nitride semiconductor light-emitting device according to Example 2 was obtained. Light output of the fabricated nitride semiconductor light-emitting device was 45 mW, 2.85 V at 30 mA.

In the present example, the proportion of thickness per one layer of the doped layer to thickness of one period of the long-period superlattice layer is higher than that in Example 1. Therefore, in the present example, the total amount of Si in the long-period superlattice layer increases while concentration of Si in the doped layer is not increased. Therefore, the average carrier concentration of the long-period superlattice layer is higher than that in Example 1. Also it is possible to increase the average carrier concentration of the long-period superlattice layer without incurring deterioration in flatness of the doped layer, so that it is possible to improve the carrier suppliability to the active layer without incurring deterioration in crystallinity of the active layer. These reveal that in the present example, the light output is comparable with that of Example 1 (45 mW), but the drive voltage can be decreased than in Example 1 (decreased from 2.9 V to 2.85 V), and hence power efficiency at the time of driving at a large current can be further improved.

Example 3

A nitride semiconductor light-emitting device according to Example 3 was produced in a method similar to that of Example 1 except that the growth temperature of the long-period superlattice layer is set lower, the proportion of thickness per one layer of the undoped layer formed of non-doped GaN to thickness per one period of the long-period superlattice layer is set lower, and concentration of Si in the barrier layer of the active layer is set lower. In the following, difference from Example 1 will be mainly shown.

Concretely, according to a method similar to that of Example 1, a buffer layer, a base layer, an n-type contact layer, an n-type clad layer, and a short-period superlattice layer were crystal-grown on an upper face of a sapphire substrate.

Next, the temperature of the film forming device was set at 850° C., and a long-period superlattice layer was crystal-grown. Concretely, a doped layer formed of Si-doped GaN and an undoped layer formed of non-doped InGaN were alternately crystal-grown periodically three times. At this time, the growth time of the undoped layer was adjusted so that thickness of each undoped layer was 2.5 nm. Carriers were diffused in the doped layer and the undoped layer and averaged, and the average carrier concentration of the long-period superlattice layer was about $3.0 \times 10^{17}$ cm$^{-3}$.

Next, an active layer was crystal-grown without changing the temperature of the film forming device. Concretely, a barrier layer formed of Si-doped GaN and a well layer formed of non-doped InGaN were alternately crystal-grown periodically three times. At this time, a Si doping amount to the barrier layer was adjusted so that concentration of Si in each barrier layer was $1.0 \times 10^{17}$ cm$^{-3}$. Carriers were diffused in the barrier layer and the well layer and averaged, and the average carrier concentration of the active layer was about $6 \times 10^{16}$ cm$^{-3}$.

Subsequently, according to a method similar to that of Example 1, on an upper face of the active layer, a p-type AlGaN layer, a p-type GaN layer and a p-type high-doped contact layer were sequentially crystal-grown, and an n-side electrode, a transparent electrode, and a p-side electrode were fabricated. In this way, the nitride semiconductor light-emitting device according to Example 3 was obtained. Light output of the nitride semiconductor light-emitting device fabricated in this manner was 45 mW, 2.82 V at 30 mA.

In this example, the proportion of thickness per one layer of the undoped layer formed of non-doped GaN to thickness of one period of the long-period superlattice layer is lower than that in Example 1. Therefore, in the present example, since the volume proportion of the undoped layer in the long-period superlattice layer is lower than that in Example 1, the average carrier concentration of the long-period superlattice layer is high. Also it is known that a rising voltage of the nitride semiconductor light-emitting device decreases when thickness per one layer of InGaN layer of the long-period superlattice layer is made small. These reveal that in the present example, the light output is comparable with that of Example 1 (45 mW), but the drive voltage can be further decreased than in Example 2 (decreased from 2.85 V to 2.82 V), and hence power efficiency at the time of driving at a large current was further improved.

Example 4

A nitride semiconductor light-emitting device according to Example 4 was produced according to a method similar to that of Example 1 except that the doped layer of the long-period superlattice layer was crystal-grown while the material of the carrier gas was varied. In the following, difference from Example 1 will be mainly shown.

Concretely, according to a method similar to that of Example 1, a buffer layer, a base layer, an n-type contact layer, an n-type clad layer, and a short-period superlattice layer were crystal-grown on an upper face of a sapphire substrate.

Next, the temperature of the film forming device was set at 855° C., and a long-period superlattice layer was crystal-grown. Concretely, a doped layer formed of Si-doped GaN and an undoped layer formed of non-doped InGaN were alternately crystal-grown periodically three times. At this time, each doped layer was grown using nitrogen gas and 3% by volume of hydrogen gas as a carrier gas. Carriers were diffused in the doped layer and the undoped layer and averaged, and the average carrier concentration of the long-period superlattice layer was about $3.0 \times 10^{17}$ cm$^{-3}$.

Subsequently, according to a method similar to that of Example 1, on an upper face of the long-period superlattice layer, a p-type AlGaN layer, a p-type GaN layer and a p-type high-doped contact layer were sequentially crystal-grown, and an n-side electrode, a transparent electrode, and a p-side electrode were fabricated. In this way, the nitride semiconductor light-emitting device according to Example 4 was obtained. Light output of the fabricated nitride semiconductor light-emitting device was 46 mW, 2.85 V at 30 mA.

In the present example, the doped layer of the long-period superlattice layer formed of Si-doped GaN was fabricated using the carrier gas containing 3% by volume of hydrogen gas. Therefore, Si is more likely to be taken into the GaN film. Therefore, even when the doped layer of the long-period superlattice layer formed of Si-doped GaN is grown at a relatively low temperature of 855° C., the average carrier concentration of the long-period superlattice layer is increased. Further, since the carrier gas contains hydrogen gas, crystals of high quality are more likely to be obtained even by growth at a low temperature, and flatness of the upper face of the long-period superlattice layer is improved, and hence crystallinity of the active layer is improved. As a result, light output was improved (improved from 45 mW to 46 mW).

Example 5

A nitride semiconductor light-emitting device of Example 5 was produced according to a method similar to that of Example 1 except that the long-period superlattice layer was crystal-grown at a higher growth temperature, the proportion of thickness per one layer of the doped layer formed of Si-doped GaN to thickness per one period of the long-period superlattice layer was made higher, the composition ratio between In and Ga in the undoped layer of the long-period superlattice layer formed of InGaN was varied, and thickness per one layer of the barrier layer of the active layer formed of Si-doped GaN was decreased. In the following, difference from Example 1 will be mainly shown.

Concretely, according to a method similar to that of Example 1, a buffer layer, a base layer, an n-type contact layer, an n-type clad layer, and a short-period superlattice layer were crystal-grown on an upper face of a sapphire substrate.

Next, the temperature of the film forming device was set at 860° C., and a long-period superlattice layer was crystal-grown. Concretely, a doped layer formed of Si-doped GaN and an undoped layer formed of non-doped InGaN were alternately crystal-grown periodically three times. At this time, the growth time of the doped layer was adjusted so that thickness of each doped layer was 6.5 nm. Since the flow rate of TMI was adjusted so that the wavelength of the light emitted by the undoped layer by photoluminescence was 445 nm, composition of In in each undoped layer was about 22%. Carriers were diffused in the doped layer and the undoped layer and averaged, and the average carrier concentration of the long-period superlattice layer was about $2.9 \times 10^{17}$ cm$^{-3}$.

Next, the temperature of the film forming device was decreased to 850° C., and an active layer was crystal-grown. Concretely, a barrier layer formed of Si-doped GaN and a well layer formed of non-doped InGaN were alternately crystal-grown periodically three times. At this time, the growth time of the barrier layer was adjusted so that thickness of each barrier layer was 4 nm. Carriers were diffused in the barrier layer and the well layer and averaged, and the average carrier concentration of the active layer was about $4.7 \times 10^{16}$ cm$^{-3}$.

Subsequently, according to a method similar to that of Example 1, on an upper face of the active layer, a p-type AlGaN layer, a p-type GaN layer and a p-type high-doped contact layer were sequentially crystal-grown, and an n-side electrode, a transparent electrode, and a p-side electrode were fabricated. In this way, the nitride semiconductor light-emitting device according to Example 5 was obtained. Light output of the fabricated nitride semiconductor light-emitting device was 48 mW, 2.8 V at 30 mA.

In the present example, since the growth temperature of the long-period superlattice layer is higher than that in Example 1, crystallinity of the long-period superlattice layer is improved, and hence flatness of the upper face of the long-period superlattice layer is improved in comparison with Example 1. Accordingly, crystal quality of the active layer is improved in comparison with Example 1. Further, since thickness per one layer of the barrier layer of the active layer is smaller than that in Example 1, the average carrier concentration of the active layer is less than or equal to $5 \times 10^{16}$ cm$^{-3}$. Therefore, electrons and holes is more likely to diffuse. Accordingly, the light output was improved (increased from 45 mW to 48 mW), and the drive voltage was decreased (decreased from 2.9 V to 2.8 V).

Example 6

A nitride semiconductor light-emitting device in Example 6 was fabricated according to the method of Example 1 except that the barrier layer of the active layer did not contain an n-type impurity. In the present example, after conducting up to the fabrication step of the short-period superlattice layer according to the method of Example 1, a long-period superlattice layer and an active layer were fabricated according to the method as shown below.

The temperature of the film forming device was set at 860° C., and a long-period superlattice layer was crystal-grown. Concretely, a doped layer formed of Si-doped GaN and an undoped layer formed of non-doped InGaN were alternately crystal-grown periodically three times. At this time, the respective growth times of the doped layer and the undoped layer were adjusted so that thickness of each doped layer was 6.5 nm and thickness of each undoped layer was 3.9 nm. Since the flow rate of TMI was adjusted so that the wavelength of the light emitted by the undoped layer by photoluminescence was 445 nm, composition of In in each undoped layer was about 22%. Carriers were diffused in the doped layer and the undoped layer and averaged, and the average carrier concentration of the long-period superlattice layer was about $2.7 \times 10^{17}$ cm$^{-3}$.

Next, the temperature of the film forming device was decreased to 850° C., and an active layer was crystal-grown. Concretely, a barrier layer formed of non-doped GaN and a well layer formed of non-doped InGaN were alternately crystal-grown periodically three times. At this time, the respective growth times of the barrier layer and the well layer were adjusted so that thickness of each barrier layer was 4 nm and thickness of each well layer was 3.9 nm. The average carrier concentration of the active layer was about $2 \times 10^{16}$ cm$^{-3}$. Thereafter, an uppermost barrier layer was crystal-grown into a thickness of 10 nm.

When the barrier layer is a non-doped layer as described above, the injected carriers are likely to diffuse in the active layer even when a large current was injected into the active layer, and local increase in current density does not occur, and hence high light emission efficiency was obtained. As a result, the light output was improved (increased from 45 mW to 50 mW).

Comparative Example 1

According to a method described in Japanese Patent Laying-Open No. 2005-109425, a nitride semiconductor light-emitting device including an active layer made up of a well layer of a non-doped InGaN layer of 3 nm thick and a barrier layer of a GaN layer of 18 nm thick doped with $1 \times 10^{17}$ cm$^{-3}$ of Si without provision of a long-period superlattice layer and a short-period superlattice layer was fabricated. Light output of the fabricated nitride semiconductor light-emitting device was 37 mW, 3.8 V at 30 mA.

<Evaluation>

For the nitride semiconductor light-emitting device according to Example 1 and the nitride semiconductor light-emitting device according to Comparative Example 1, external quantum efficiency was measured at various drive currents. Concretely, light output when each drive current was flown was measured, and external quantum efficiency was calculated from the light output. Then, the result shown in FIG. 2 was obtained.

Figure 2:
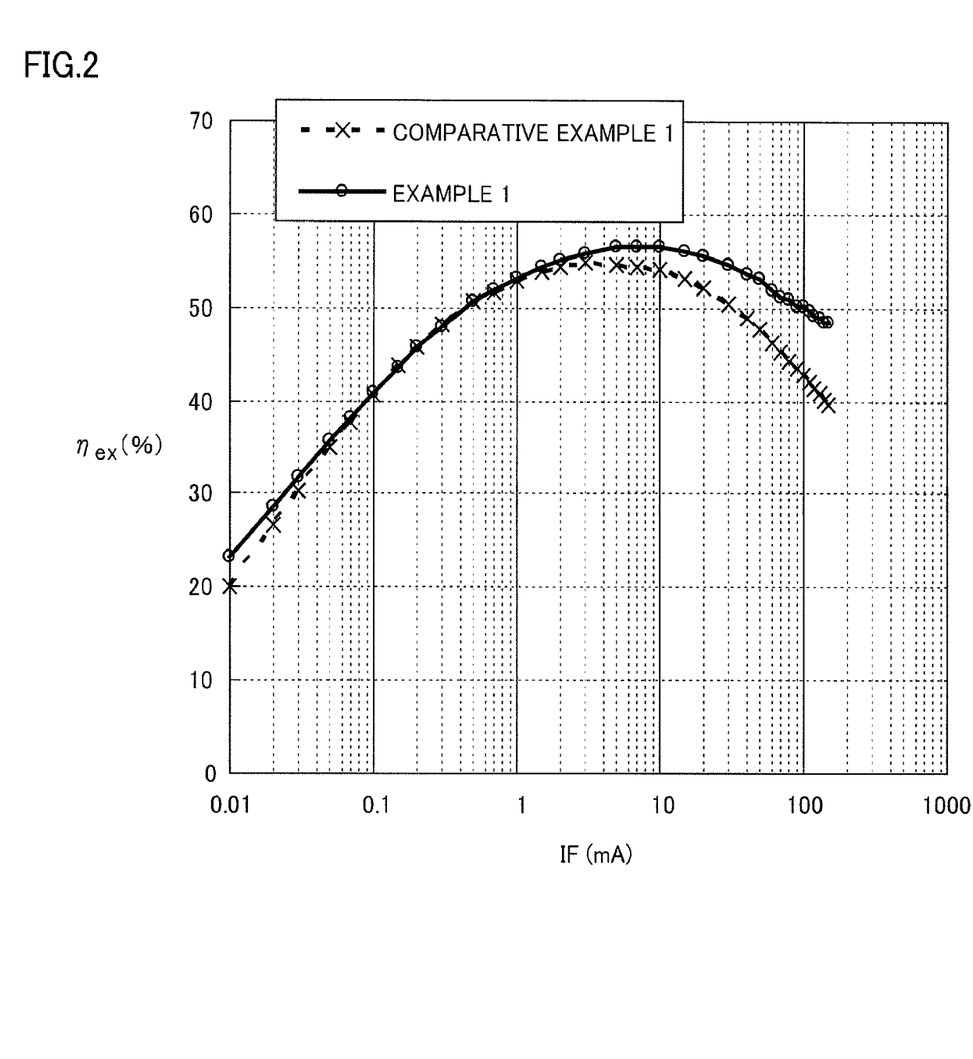
FIG. 2 is a graph showing change in external quantum efficiency $\eta_{ex}$ with drive current IF in Example 1 and Comparative Example 1.

As shown in FIG. 2, at drive current IF of less than or equal to 1 mA, there was no significant difference in external quantum efficiency $\eta_{ex}$ between Example 1 and Comparative Example 1. However, when drive current IF exceeded 1 mA, the external quantum efficiency $\eta_{ex}$ was larger in Example 1, and as drive current IF increased, difference in external quantum efficiency $\eta_{ex}$ increased. It can be concluded that in Example 1, deterioration in power efficiency at the time of driving at a large current is prevented.

Also, for the nitride semiconductor light-emitting device according to Example 1 and the nitride semiconductor light-emitting device according to Comparative Example 1, C-V characteristics were determined, and the carrier concentration was calculated based on the C-V characteristic. Then, the result shown in FIG. 3 was obtained.

Figure 3:
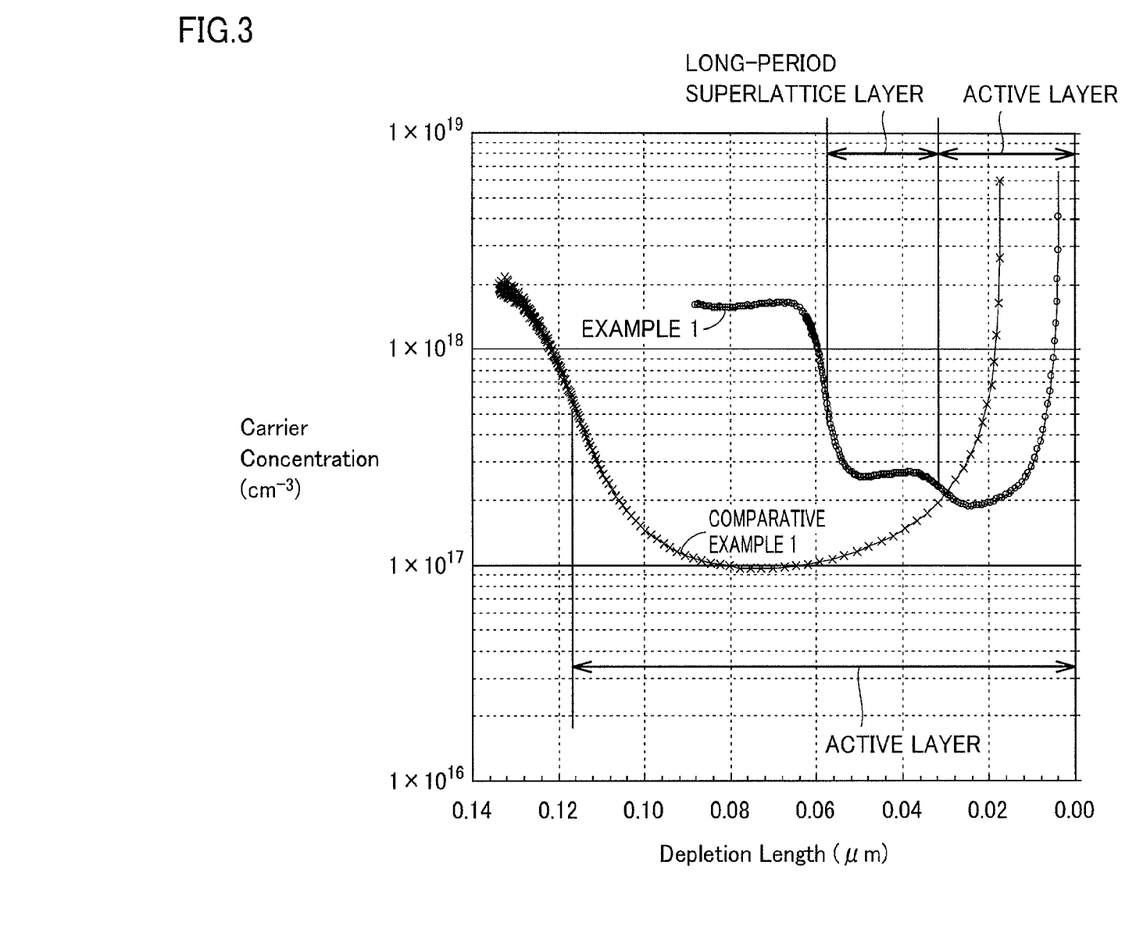
FIG. 3 is a graph showing change in carrier concentration in Example 1 and Comparative Example 1.

As shown in FIG. 3, in Example 1, the average carrier concentration of the active layer is $2 \times 10^{17}$ cm$^{-3}$, the average carrier concentration of the long-period superlattice layer is $2.6 \times 10^{17}$ cm$^{-3}$. From this, it is conceived that the average carrier concentration of the long-period superlattice layer is larger than the average carrier concentration of the active layer.

In Example 1, the long-period superlattice layer having a higher average carrier concentration than the active layer is provided in comparison with Comparative Example 1. From this, it can be concluded that the average carrier concentration of the active layer in Example 1 is higher than the average carrier concentration of the active layer in Comparative Example 1. Therefore, it is conceived that in Example 1, deterioration in power efficiency at the time of driving at a large current is prevented in comparison with Comparative Example 1.

In Comparative Example 1, thickness of the barrier layer of the active layer is larger than that in Example 1. Therefore, thickness per one layer of the active layer in Comparative Example 1 is larger than thickness per one layer of the active layer in Example 1. Therefore, it is concluded that in Comparative Example 1, the drive voltage of the nitride semiconductor light-emitting device is increased, and the power efficiency is decreased.

Also, in Example 1, as shown in FIG. 3, a layer having a higher average carrier concentration than the long-period superlattice layer (corresponding to short-period superlattice layer) is provided on the side closer to the substrate than the long-period superlattice layer (position deeper than the long-period superlattice layer). Therefore, it is expected that the depletion layer extends only to the short-period superlattice layer when an inversely-biased current is applied to the nitride semiconductor light-emitting device according to Example 1. Therefore, even when there is a defect in the n-type nitride semiconductor layer, the depletion layer will not extend to the n-type nitride semiconductor layer where the defect exists, and hence an electric field will not be exerted on the defect. Further, owing to the narrow depletion layer, discharge by a tunneling current or the like occurs effectively, and a large current will not concentrate in part of defects. Therefore, it is concluded that even when an inversely-biased current is applied to the nitride semiconductor light-emitting device according to Example 1, occurrence of electrostatic destruction in the nitride semiconductor light-emitting device according to Example 1 can be prevented.

On the other hand, in Comparative Example 1, as shown in FIG. 3, a layer having a higher average carrier concentration than the active layer is not provided on the side of the substrate from the active layer. Therefore, it is concluded that when an inversely-biased current is applied to the nitride semiconductor light-emitting device according to Comparative Example 1, the depletion layer can extend to the n-type nitride semiconductor layer, and the current can concentrate in a defect (dislocation) existing in the n-type nitride semiconductor layer and electrostatic destruction can occur.

While embodiments and examples have been described above, it is originally planned to appropriately combine features of these embodiments and examples.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising:
   a sapphire substrate having a convexoconcave-worked upper face;
   a base layer made of $Al_{s1}Ga_{t1}In_{u1}N$ ($0 \leq s1 \leq 1$, $0 \leq t1 \leq 1$, $0 \leq u1 \leq 1$, $s1+t1+u1 \neq 0$) provided on a growth face of the sapphire substrate;
   a contact layer made of a nitride semiconductor of an n-type, provided on said base layer;
   a superlattice layer provided on said contact layer and including impurities of the n-type;
   an active layer provided on said superlattice layer and including impurities of the n-type; and
   a nitride semiconductor layer of a p-type, provided on said active layer, wherein
   an average carrier concentration of said superlattice layer is higher than an average carrier concentration of said active layer,
   wherein the superlattice layer consists essentially of nitride semiconductors, and
   the sapphire substrate, the base layer, the contact layer, the superlattice layer, the active layer, and the nitride semiconductor layer are arranged in this order.

2. The nitride semiconductor light-emitting device according to claim 1, wherein the average carrier concentration of said superlattice layer is greater than or equal to 1.2 times the average carrier concentration of said active layer.

3. The nitride semiconductor light-emitting device according to claim 1, wherein said superlattice layer has two or more layers of a doped layer.

4. The nitride semiconductor light-emitting device according to claim 1, wherein
said active layer has a well layer and a barrier layer, and
said barrier layer is an undoped layer not containing a conductive-type impurity, or a concentration of the conductive-type impurity in said barrier layer is less than or equal to $8\times10^{17}$ cm$^{-3}$.

5. The nitride semiconductor light-emitting device according to claim 1, wherein
said active layer has a well layer and a barrier layer, and
a concentration of the impurities of the n-type in said barrier layer is higher than a concentration of the impurities of the n-type in said well layer.

* * * * *